(12) United States Patent
Ueda

(10) Patent No.: US 7,735,043 B2
(45) Date of Patent: Jun. 8, 2010

(54) WIRING LAYOUT APPARATUS, WIRING LAYOUT METHOD, AND WIRING LAYOUT PROGRAM FOR SEMICONDUCTOR INTEGRATED CIRCUIT

(75) Inventor: Toshiaki Ueda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 368 days.

(21) Appl. No.: 11/733,940

(22) Filed: Apr. 11, 2007

(65) Prior Publication Data
US 2007/0245286 A1    Oct. 18, 2007

(30) Foreign Application Priority Data
Apr. 17, 2006    (JP)    .............................. 2006-113783

(51) Int. Cl.
G06F 17/50    (2006.01)
(52) U.S. Cl. ...................................................... 716/12
(58) Field of Classification Search ..................... 716/12
See application file for complete search history.

(56) References Cited

U.S. PATENT DOCUMENTS 5,638,292 A    6/1997    Ueda 6,990,597 B2 *    1/2006    Abe et al. .................... 713/500
7,331,027 B2 *    2/2008    Meaney ........................ 716/11
7,392,496 B1 *    6/2008    Schultz et al. ................ 716/10

FOREIGN PATENT DOCUMENTS

JP    2003308351 A  *  10/2003

OTHER PUBLICATIONS

Machine translation of JP 2003308351 A using http://www19.ipdl.inpit.go.jp/PA1/cgi-bin/PA1INIT?1176720631969.*

* cited by examiner

*Primary Examiner*—Jack Chiang
*Assistant Examiner*—Brandon W Bowers
(74) *Attorney, Agent, or Firm*—Turocy & Watson, LLP

(57) ABSTRACT

A wiring layout apparatus includes a layout design unit configured to design a wiring layout for a semiconductor integrated circuit; a critical wiring detection unit configured to analyze a delay of signal propagation in the wiring layout so as to detect wiring strip conductors that configure a signal path whose timing is critical; a rewiring unit configured to rearrange the wiring strip conductors so as to improve the uniformity of a wiring pattern of an area in the vicinity of the critical wiring strip conductor, with regard to the wiring layout; and a strip-conductor-size variation determination unit configured to evaluate the uniformity of the pattern of the rearranged wiring layout so as to determine whether or not variation in the size of the critical wiring strip conductor falls within a tolerance range.

6 Claims, 7 Drawing Sheets

WIRING LAYOUT APPARATUS, WIRING LAYOUT METHOD, AND WIRING LAYOUT PROGRAM FOR SEMICONDUCTOR INTEGRATED CIRCUIT

CROSS-REFERENCE TO RELATED APPLICATIONS

This application is based upon and claims the benefit of priority from the prior Japanese Patent Application No, 2006-113783 filed on Apr. 17, 2006; the entire contents of which are incorporated herein by reference.

BACKGROUND OF THE INVENTION

1. Field of the Invention

The present invention relates to a wiring layout apparatus, a wiring layout method, and a wiring layout program for a semiconductor integrated circuit, and particularly to a wiring layout apparatus, a wiring layout method, and a wiring layout program, for a semiconductor integrated circuit, configured to lay out wiring strip conductors whose width and the spaces therebetween are as small as the resolution limit of an exposure apparatus.

2. Description of the Related Art

To date, in designing a wiring layout for a semiconductor integrated circuit, based on the assumption that the respective characteristics of circuit elements and parasitic elements on the chip are approximately homogeneous, the design has been performed with a margin. In other words, on the assumption that, even though some variations exist in the characteristics of the elements on the chip, the variations fall within a tolerance range, designing of a wiring layout for a semiconductor integrated circuit has been performed in consideration only of a desirable timing specification.

In recent years, due to promotion of device miniaturization, the dimension of a strip conductor such as a wiring strip conductor drawn on a semiconductor substrate has become smaller than the light-source wavelength of a drawing exposure apparatus; therefore, it has become difficult to process wiring strip conductors in accordance with intended design sizes. In particular, due to the miniaturization and the high-density integration of a mask pattern, pattern arrangement and adjacency relationship affect largely each other in a process of forming strip conductors through photolithography or etching processing. In order to cope with the foregoing problem, the optical proximity correction processing (hereinafter, described as OPC processing), in which a correction pattern is preliminarily added to a designed pattern, is generally performed so that the size of a processed strip conductor becomes equal to the desirable size of the strip conductor.

However, in order to accurately realize a densely integrated layout pattern, through the OPC processing, considerably large data processing time is required. In addition, depending on the combination of the shapes of adjacent strip conductors, a variation in processing size is caused, and a parasitic capacitance and a resistance also vary; thus, a delay, of a signal that propagates on the wiring strip conductors, which is a critical path in timing design, is caused to vary. In other words, because, in the OPC processing, the designed pattern is not sufficiently corrected, the sizes of the processed strip conductors do not become the desirable size, whereby electrical characteristics, especially a delay, of a signal that propagates on the wiring strip conductors, which is a critical path in timing design, is caused to vary. Accordingly, it has been a problem that a chip is produced that cannot realize a preliminarily set operating frequency, thereby deteriorating the yield rate of the chip.

As measures for the variation in the size of a strip conductor, semiconductor integrated circuit devices have been proposed (e.g., refer to Japanese Patent Application Laid-Open No. 2005-303089) in which, by adding dummy strip conductors each having a predetermined regularity to a designed pattern, the variation in the size of a strip conductor due to processing is suppressed.

However, it has been a problem that, because, with the miniaturization of devices in recent years, wiring has come to be densely formed in an overall chip, a vacant space where no wiring is laid has become very small, whereby, it is difficult to add dummy strip conductors to a designed pattern, as is the case with the semiconductor integrated circuit device disclosed in Japanese Patent Application Laid-Open No. 2005-303089.

BRIEF SUMMARY OF THE INVENTION

A wiring layout apparatus for a semiconductor integrated circuit, according to one embodiment of the present invention includes a layout design unit configured to design a wiring layout for a semiconductor integrated circuit; a critical wiring detection unit configured to analyze a delay of signal propagation in the wiring layout so as to detect wiring strip conductors that configure a signal path whose timing is critical; a rewiring unit configured to rearrange the wiring strip conductors so as to improve the uniformity of a wiring pattern of an area in the vicinity of the critical wiring strip conductor, with regard to the wiring layout; and a strip-conductor-size variation determination unit configured to evaluate the uniformity of the pattern of the rearranged wiring layout so as to determine whether or not variation in the size of the critical wiring strip conductor falls within a tolerance range.

DETAILED DESCRIPTION OF THE EMBODIMENTS OF THE INVENTION

Figure 1:
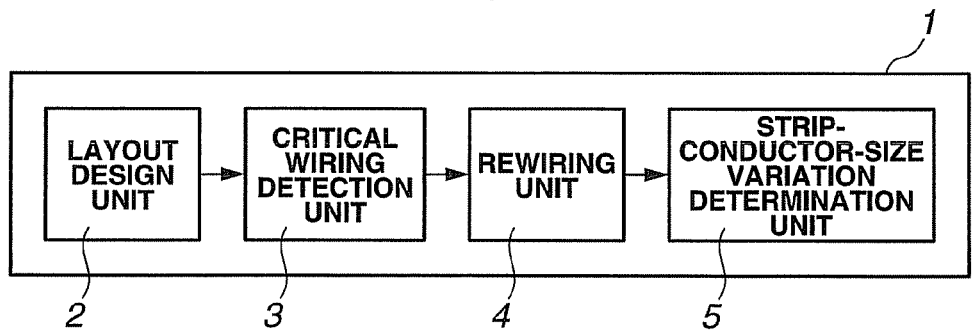
FIG. 1 is a schematic diagram for explaining the configuration of a semiconductor-integrated-circuit wiring layout apparatus 1 according to an embodiment of the present invention.

An embodiment of the present invention will be explained below, with reference to the drawings. In the first place, the configuration of a semiconductor-integrated-circuit wiring layout apparatus, according to an embodiment of the present invention will be explained with reference to FIG. 1. FIG. 1 is a schematic diagram for explaining the configuration of a semiconductor-integrated-circuit wiring layout apparatus 1 according to an embodiment of the present invention.

As illustrated in FIG. 1, the semiconductor-integrated-circuit wiring layout apparatus 1 is configured with a layout design unit 2, a critical wiring detection unit 3, a rewiring unit 4, and a strip-conductor-size variation determination unit 5.

In the layout design unit 2, a semiconductor-integrated-circuit ordinary wiring layout is performed in which, based on a logic-circuit diagram, the arrangement of elements and wiring strip conductors is laid out by use of a CAD system or the like. In the critical wiring detection unit 3, based on the wiring layout designed in the layout design unit 2, a strip conductor that is supposed to be a bottleneck in terms of timing design is detected as a delay critical path (hereinafter, described as a delay CP). For example, a clock-signal wiring strip conductor on a chip corresponds to a delay CP.

In the rewiring unit 4, it is examined whether or not rewiring of the area adjacent to the delay CP detected in the critical wiring detection unit 3 is required, and then rewiring is performed, as may be necessary. In the case where a wiring pattern is not uniform, dimensional variations in the sizes of the wiring strip conductors are caused in the OPC processing and an actual processing. Accordingly, by uniformizing the wiring pattern, the dimensional variations can be suppressed. However, the wiring layout designed in the layout design unit 2 is optimized in terms of wiring efficiency; the renewing of the wiring layout deteriorates the wiring efficiency. Thus, in the rewiring unit 4, the rewiring processing is performed in such a way that only the areas where signal delays due to the variations, in capacitances and resistances, which are caused by dimensional variations of the wiring strip conductors should not be produced, i.e., only the areas in the vicinity of delay CPs are rewired, as may be necessary, and that the wiring strip conductors with which signal delays fall within a tolerance range even though signal delay is caused due to the dimensional variation are not renewed.

The nonuniformity in the wiring strip conductors in the vicinity a delay CP is evaluated, for example, by detecting a wiring filling rate (the proportion of the whole area of wiring strip conductors in a predetermined evaluation area to the predetermined evaluation area) or determining whether or not local concentration of wiring ends exists. In the area where the wiring filling rate is too high, or wiring ends are concentrated, a failure, such as decrease in an exposure margin in the lithography processing, is posed; thus, part of a wiring strip conductor in a photoresist mask to be formed on the chip may be lost, or a wiring strip conductor may be formed in a size deviated from a desirable size. Also in the area where, in contrast, the wiring filling rate is too low, a wiring strip conductor may be formed in a size that is deviated from a desirable size.

In the rewiring unit 4, the adjacent area of a region, which has been determined to be non-uniform by evaluating, as described above, the uniformity of the wiring pattern, are rewired. The rewiring method includes, for example, the following three methods:

In the first place, the first method is to move a wiring strip conductor. The first method is to make a wiring strip conductor move from the area in the vicinity of a delay CP to an area that is away from the delay CP and in which no wiring strip conductor is laid, or, contrary to the above, the first method is to make a wiring strip conductor laid in an area that is away from a delay CP move to the area that is in the vicinity of a delay CP and in which no wiring strip conductor is laid.

In the second place, the second method is an interchange of wiring strip conductors. The second method is to interchange a wiring strip conductor laid in the area in the vicinity of a delay CP with a wiring strip conductor in an area that is away from the delay CP. In the last place, the third method is to extend a wiring strip conductor. The third method is to extend a wiring strip conductor laid in the area in the vicinity of a delay CP so as to move the end position thereof.

In consideration of the situation of adjacent wiring strip conductors, the effectiveness to the improvement of the uniformity of a wiring pattern, and the like, one or more methods among the foregoing methods are combined so as to perform rewiring.

At the last stage, in the strip-conductor-size variation determination unit 5 in which the uniformity of a pattern is evaluated so as to determine whether or not variations in the sizes of critical wiring strip conductors fall within a tolerance range, based on the wiring layout obtained through the rewiring in the rewiring unit 4, strip-conductor-size variation determination processing is performed in which the uniformity of a pattern is evaluated so as to determine whether or not variations in the sizes of critical wiring strip conductors fall within a tolerance range. Because the uniformity of a wiring pattern is improved in the rewiring unit 4, the variation in the delay of a signal that propagates on a critical strip conductor can be suppressed.

Next, a wiring layout method utilizing the foregoing semiconductor-integrated-circuit wiring layout apparatus 1 will be explained with reference to FIGS. 2 to 5, 6A, 6B, 7A, 7B, 8, 9A, 9B, 10A, 10B, 11A, and 11B.

In the first place, in the layout design unit 2, an ordinary wiring layout is performed in which, based on a logic circuit diagram designed in order to realize the function and the performance of a chip, an arrangement of actual elements and wiring strip conductors is automatically drawn by use of a CAD system or the like. In the case where the semiconductor integrated circuit has a plurality of wiring layers, the layout design is applied to each of the plurality of wiring layers. Next, in the critical wiring detection unit 3, a delay CP is detected based on the wiring layout designed in the layout design unit 2. In addition, one wiring layer may have a plurality of delay CPs; therefore, in the process carried out in the critical wiring detection unit 3, all delay CPs included in each wiring layer are detected.

Figure 2:
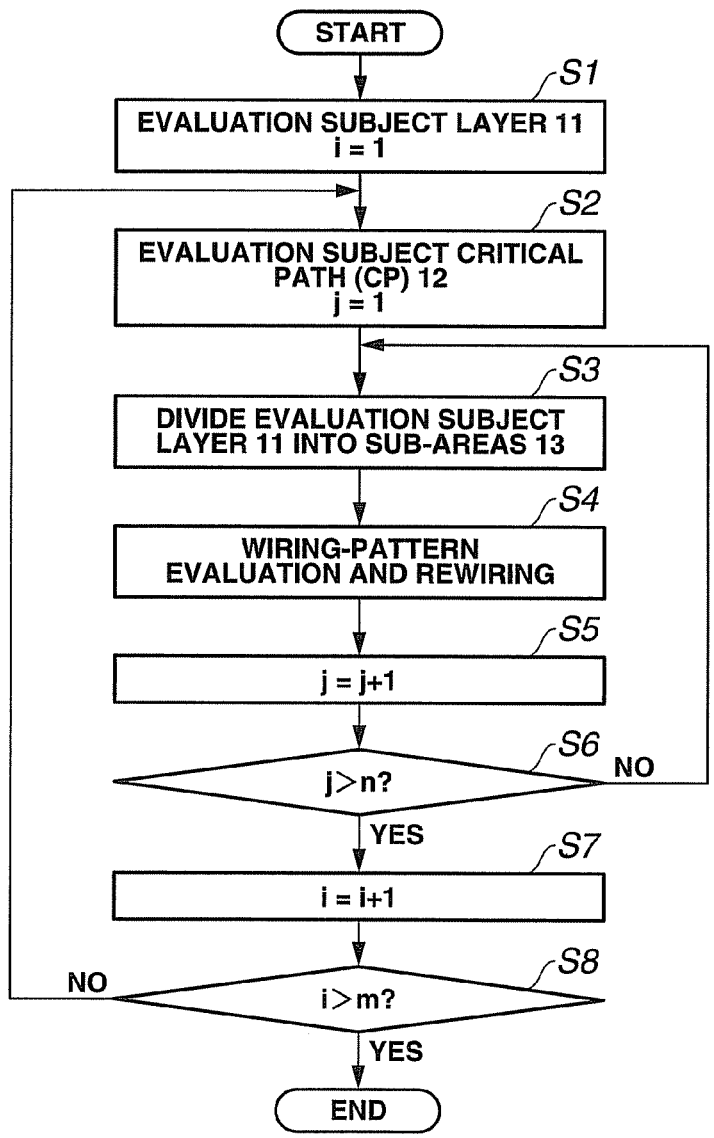
FIG. 2 is a flowchart for explaining the procedure of a wiring layout method according to an embodiment of the present invention.

Subsequently, in the rewiring unit 4, the adjacent area of a delay CP is rewired. The processing in the rewiring unit 4 will be explained in detail below, with reference to FIG. 2. FIG. 2 is a flowchart for explaining the procedure of a wiring layout method according to an embodiment of the present invention.

Figure 3:
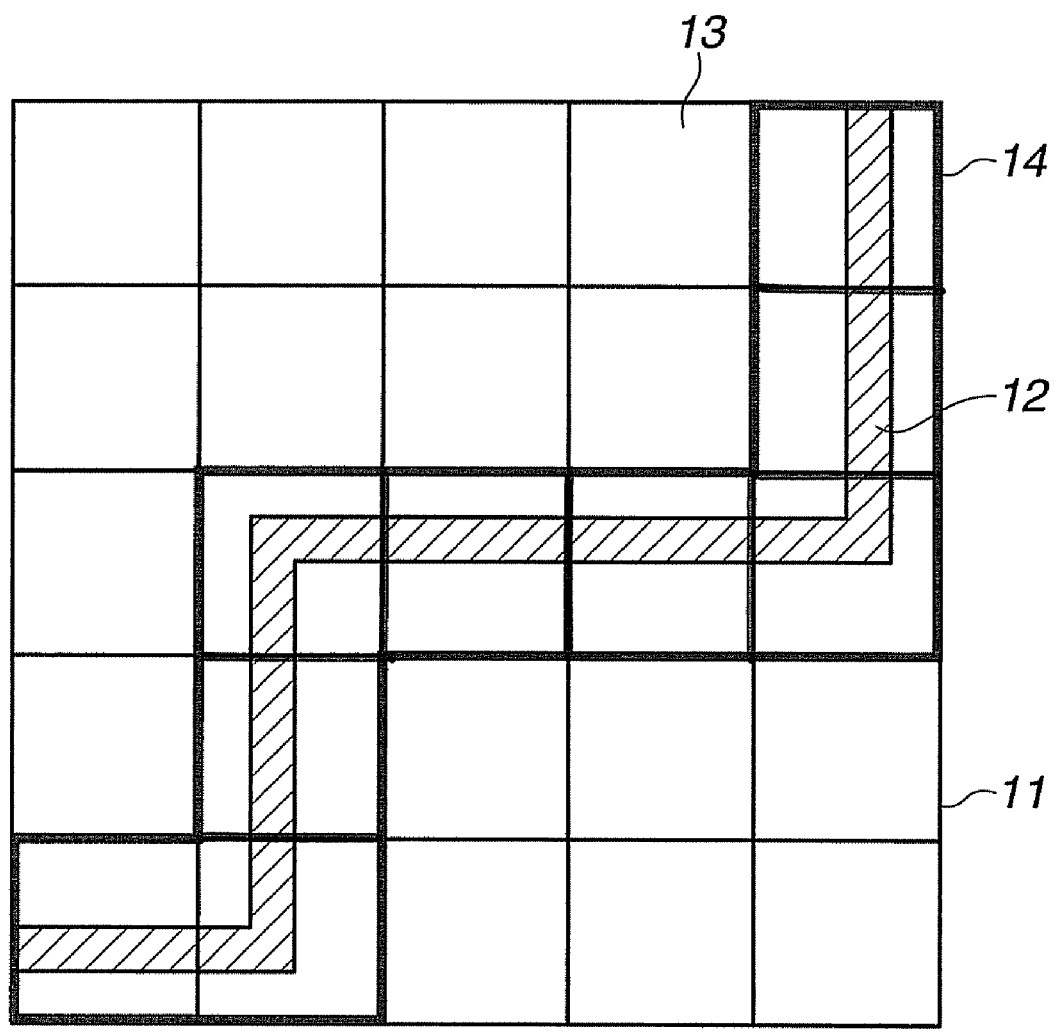
FIG. 3 is a schematic chart for explaining the configuration of the evaluation subject layer 11 that has been divided into the sub-areas 13.

Firstly, in the step S1, as a wiring layer 11 (hereinafter, described as a evaluation subject layer 11) that is subject to evaluation on whether or not rewiring is required, a first layer is selected. Subsequently, in the step S2, a CP12 (hereinafter, described as an evaluation subject CP 12), among delay CPs included in the evaluation subject layer 11, which is subject to evaluation on whether or not rewiring is required is selected. Subsequently, in the step S3, the evaluation subject layer 11 is divided into a plurality of sub-areas 13 (refer to FIG. 3) each having the same shape and the same area. FIG. 3 is a schematic chart for explaining the configuration of the evaluation subject layer 11 that has been divided into the sub-areas 13. For example, as represented in FIG. 3, after the step S3 is completed, the evaluation subject layer 11 is divided into 25 (5×5) sub-areas 13 that each has the same shape and the same area. In addition, the evaluation subject layer 11 is required to be divided into areas whose sizes are each so large as to correct the optical proximity effect in a photolithography process; thus, the evaluation subject layer 11 is divided into the square sub-areas 13 each having an area of 1 μm×1 μm.

Figure 4:
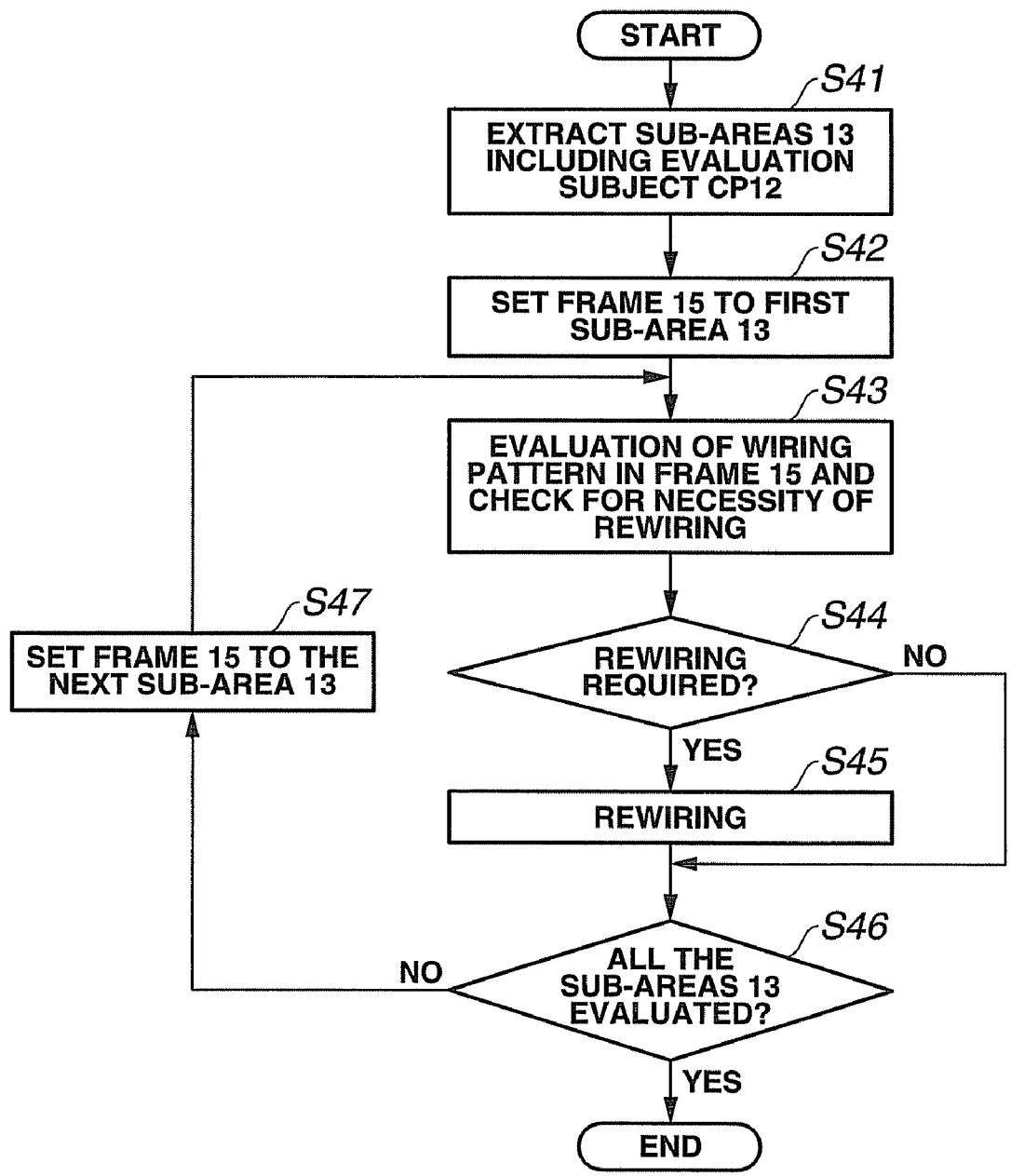
FIG. 4 is a flowchart for explaining the procedure of determination of necessity of rewiring in areas in the vicinity of the evaluation subject CP12 and the procedure of rewiring.

Next, in the step S4, the wiring strip conductors in the areas in the vicinity of the evaluation subject CP12 are evaluated; when it is determined that rewiring is needed, the rewiring is performed. The detailed procedure of the step S4 will be explained with reference to FIG. 4. FIG. 4 is a flowchart for explaining the procedure of determination of necessity of rewiring in areas in the vicinity of the evaluation subject CP12 and the procedure of rewiring.

Firstly, in the step S41, the sub-areas 13, in the evaluation subject layer 11, which include the evaluation subject CP12 are extracted as evaluation subject areas. For example, in FIG. 3, nine sub-areas 13 surrounded by a thick line are extracted as evaluation subject areas 14.

Figure 5:
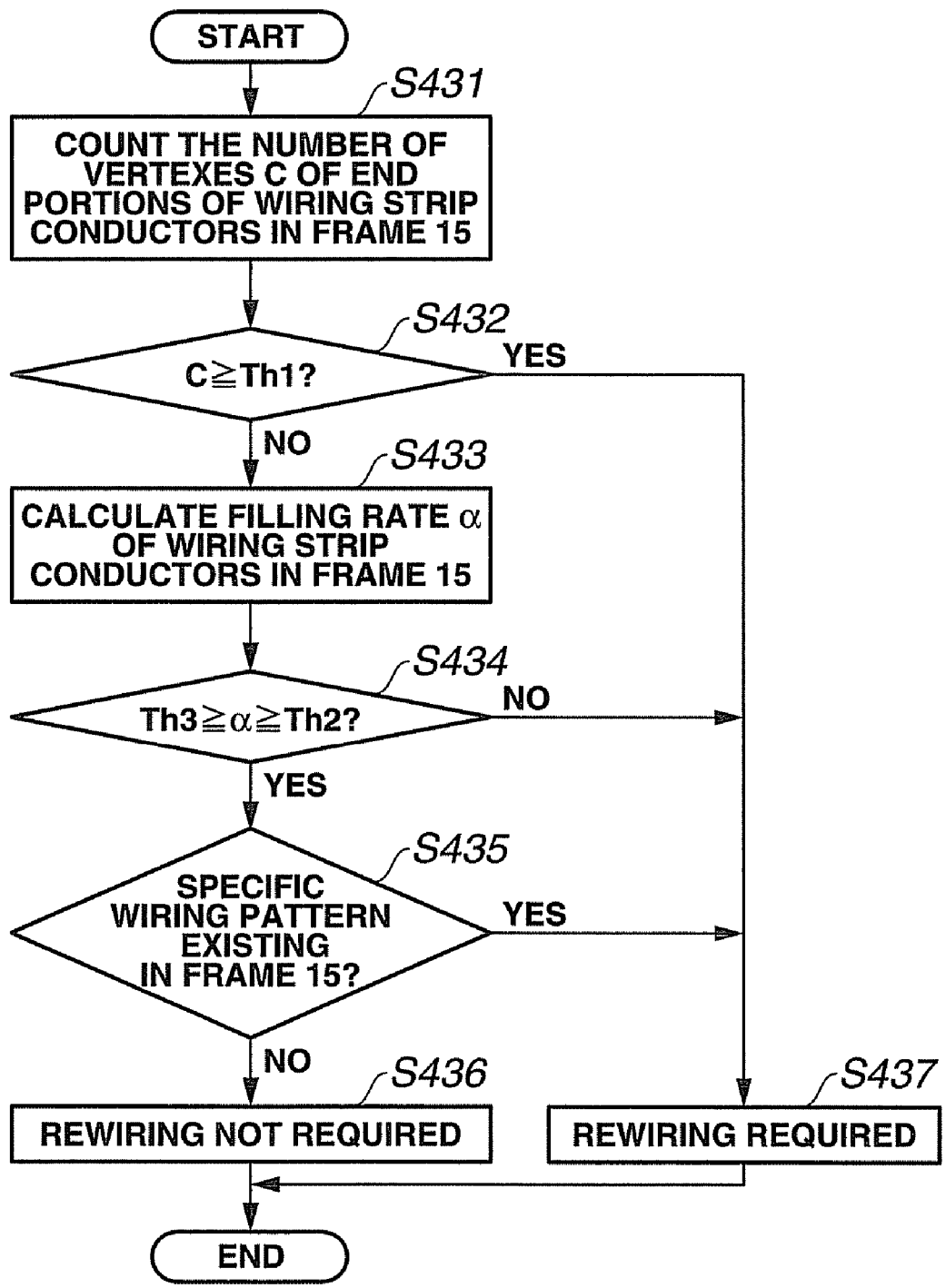
FIG. 5 is a flowchart for explaining the procedure of the determination of necessity of rewiring.

Next, in the step S42, a frame 15 is set to the first sub-area 13, among the sub-areas 13 included in the evaluation subject area 14, to which the determination of necessity of rewiring is applied. In addition, the determination of necessity of rewiring is applied to all the sub-areas 13 included in the evaluation subject area 14. Subsequently, in the step S43, the wiring strip conductor in each of the sub-areas 13 to which the frame 15 is set is evaluated so as to perform the determination of necessity of rewiring of the vicinity of the evaluation subject CP12 within the frame 15. The detailed procedure of the step S43 will be explained with reference to FIG. 5. FIG. 5 is a flowchart for explaining the procedure of the determination of necessity of rewiring.

Figure 6A:
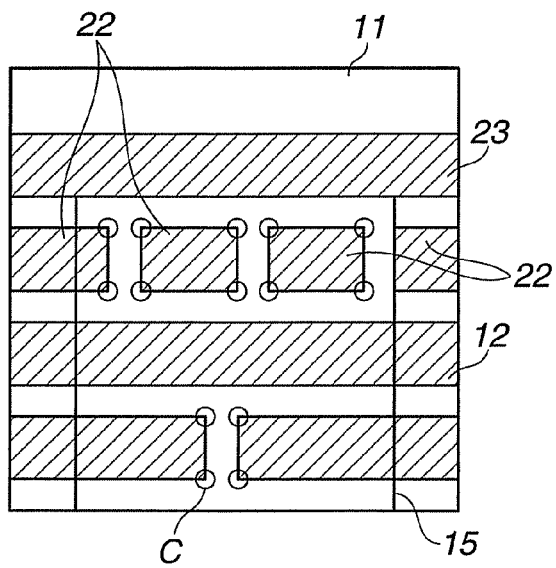
FIG. 6A is a layout chart for explaining an example of wiring strip conductors in the vicinity of the evaluation subject CP12 in the case where rewiring has not been performed yet.
Figure 6B:
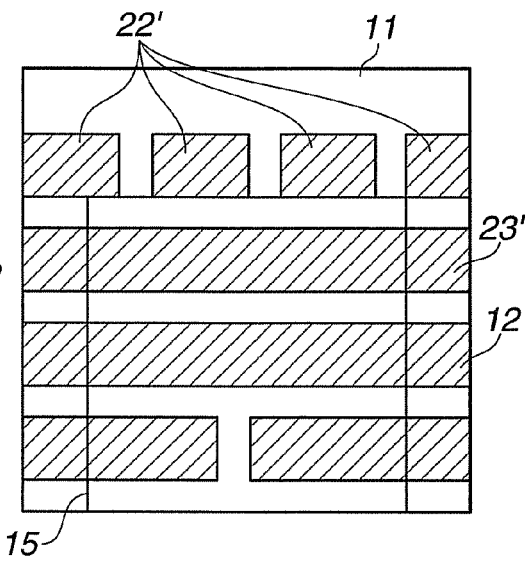
FIG. 6B is a layout chart for explaining an example of wiring strip conductors in the vicinity of the evaluation subject CP12 in the case where rewiring has been performed.

Firstly, in the step S431, in the case where any end portion of a wiring strip conductor exists within the frame 15, the number C of the vertexes is counted. For example, in the case where wiring strip conductors as represented in FIG. 6A are laid out in the frame 15, the number C of the vertexes is the number of the vertexes each surrounded by a circular symbol, i.e., fourteen. FIG. 6A is a layout chart for explaining an example of wiring strip conductors in the vicinity of the evaluation subject CP12 in the case where rewiring has not been performed yet. And, FIG. 6B is a layout chart for explaining an example of wiring strip conductors in the vicinity of the evaluation subject CP12 in the case where rewiring has been performed.

Next, in the step S432, it is determined whether or not the number C, of the vertexes of the end portions of the wiring strip conductors, which has been counted in the step S431 is the same as or larger than a preliminarily set threshold value Th1. Note that, the threshold value Th1, which is an integer larger than one, is set to an appropriate value in accordance with a process condition or the like. In the step S432, in the case where the number C of the vertexes of the end portions of the wiring strip conductors is the same as or larger than the threshold value Th1, the step S432 is followed by the step S437, it is determined that, in the sub-areas 13 to which the frame 15 has been set, the rewiring of the areas in the vicinity of the evaluation subject CP12 is needed, and the determination of necessity of rewiring is ended.

In contrast, in the step S432, in the case where the number C of the vertexes of the end portions of the wiring strip conductors is smaller than the threshold value Th1, it is considered that, in the sub-areas 13 to which the frame 15 has been set, no local concentration, of the wiring strip conductor end portion, which causes variations in the sizes of the wiring strip conductors in a lithography process is posed; then, the step S432 is followed by the step S433.

In the step S 433, a wiring filling rate a with regard to the wiring strip conductors included in the frame 15 is calculated. The wiring filling rate α is calculated by dividing the sum of the respective areas of the wiring strip conductors laid within the frame 15 by the area of the frame 15 (equal to the area of the sub-area 13). Next, in the step S434, it is determined whether or not the wiring filling rate a which has been calculated in the step S433 is the same as or larger than a preliminarily set threshold value Th2 and the same as or smaller than a preliminarily set threshold value Th3. Note that, the threshold values Th2 and Th3, which are each larger than zero and smaller than one, are set to respective appropriate values in accordance with a process condition or the like. Additionally, the threshold value Th2 is set to a smaller value than the threshold value Th3 is.

In the step S434, in the case where the wiring filling rate α is smaller than the threshold value Th2, or larger than the threshold value Th3, the step S434 is followed by the step S437; it is determined that, in the sub-areas 13 to which the frame 15 has been set, the rewiring of the areas in the vicinity of the evaluation subject CP12 is needed, and the determination of necessity of rewiring is ended.

In contrast, in the step S434, the wiring filling rate α is the same as or larger than the threshold value Th2 and the same as or smaller than the threshold value Th3, it is considered that, in the sub-areas 13 to which the frame 15 has been set, variation, in the size of the wiring strip conductor, represented by the phenomena that, because the wiring filling rate α is too low, i.e., the wiring strip conductors are laid out spaced largely apart from one another, the thicknesses of the wiring strip conductors are widened, or that, because the wiring filling rate α is too high, i.e., the wiring strip conductors are laid out in a high-density manner, part or all of the wiring strip conductors are lost or narrowed does not occur; then, the step S434 is followed by the step S435.

Figure 7A:
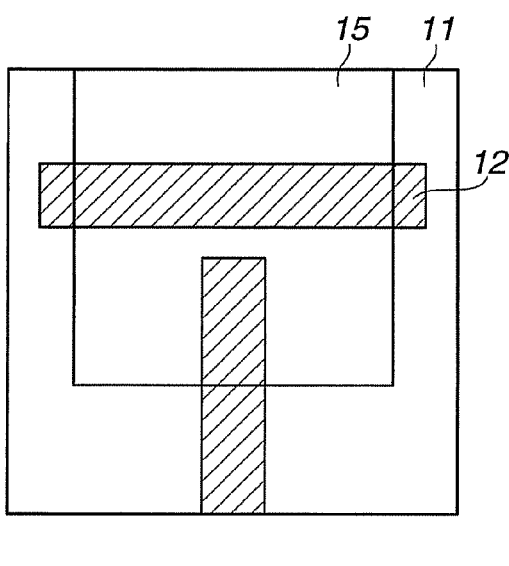
FIGS. 7A and 7B are layout charts each representing an example of a wiring pattern that causes variation in the size of a wiring strip conductor.
Figure 7B:
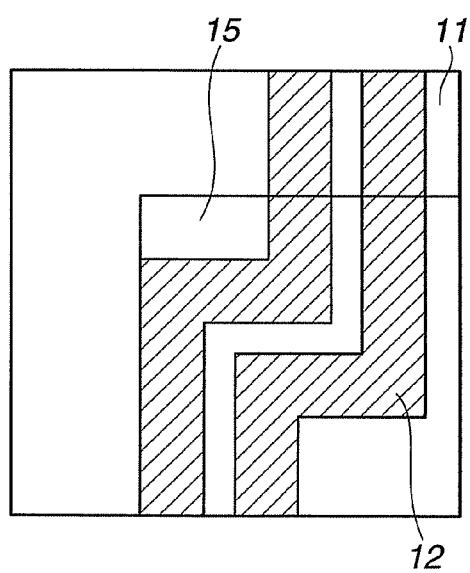

In the step S435, it is determined whether or not any specific wiring pattern, which causes, in a lithography process, variation in the size of the wiring strip conductor, is included in the frame 15. The specific wiring pattern includes, e.g., wiring patterns as represented in FIGS. 7A and 7B. FIGS. 7A and 7B are layout charts each representing an example of a wiring pattern that causes variation in the size of a wiring strip conductor.

A specific example is exemplified by a wiring pattern in which, as represented in FIG. 7A, one end portion of another wiring strip conductor exists in the vicinity of the evaluation subject CP12, and the respective extension directions of that wiring strip conductor and the evaluation subject CP12 are perpendicular to each other. In addition, another specific example is exemplified by a wiring pattern in which, as represented in FIG. 7B, another wiring strip conductor is laid in the areas in the vicinity of the crank-shaped evaluation subject CP12 in such a way as to be in parallel with the evaluation subject CP12. Such specific wiring patterns are set prior to the determination of necessity of rewiring; new wiring patterns can additionally be registered, as may be necessary.

In the step S435, in the case where, in the frame 15, any specific wiring pattern is detected, the step S435 is followed by the step S437; it is determined that, in the sub-areas 13 to which the frame 15 has been set, the rewiring of the areas in the vicinity of the evaluation subject CP12 is needed, and the determination of necessity of rewiring is ended. In contrast, in the step S435, in the case where, in the frame 5, no specific wiring pattern is detected, it is determined that the wiring pattern in the sub-areas 13 is appropriate and no rewiring is necessary; then, the determination of necessity of rewiring is ended.

In the case where, in the step S44, it is determined that rewiring is required, based on the result of the determination, of necessity of rewiring, which has been performed in the step S43 as described above, the step S44 is followed by the step S45. After, in the sub-areas 13 to which the frame 15 is set, the areas in the vicinity of the evaluation subject CP12 are rewired, the step S45 is followed by the step S46. In contrast, in the step S44, in the case where it is determined that rewiring is not required, the step L44 is followed by the step S46, while the step S45 is omitted.

Figure 8:
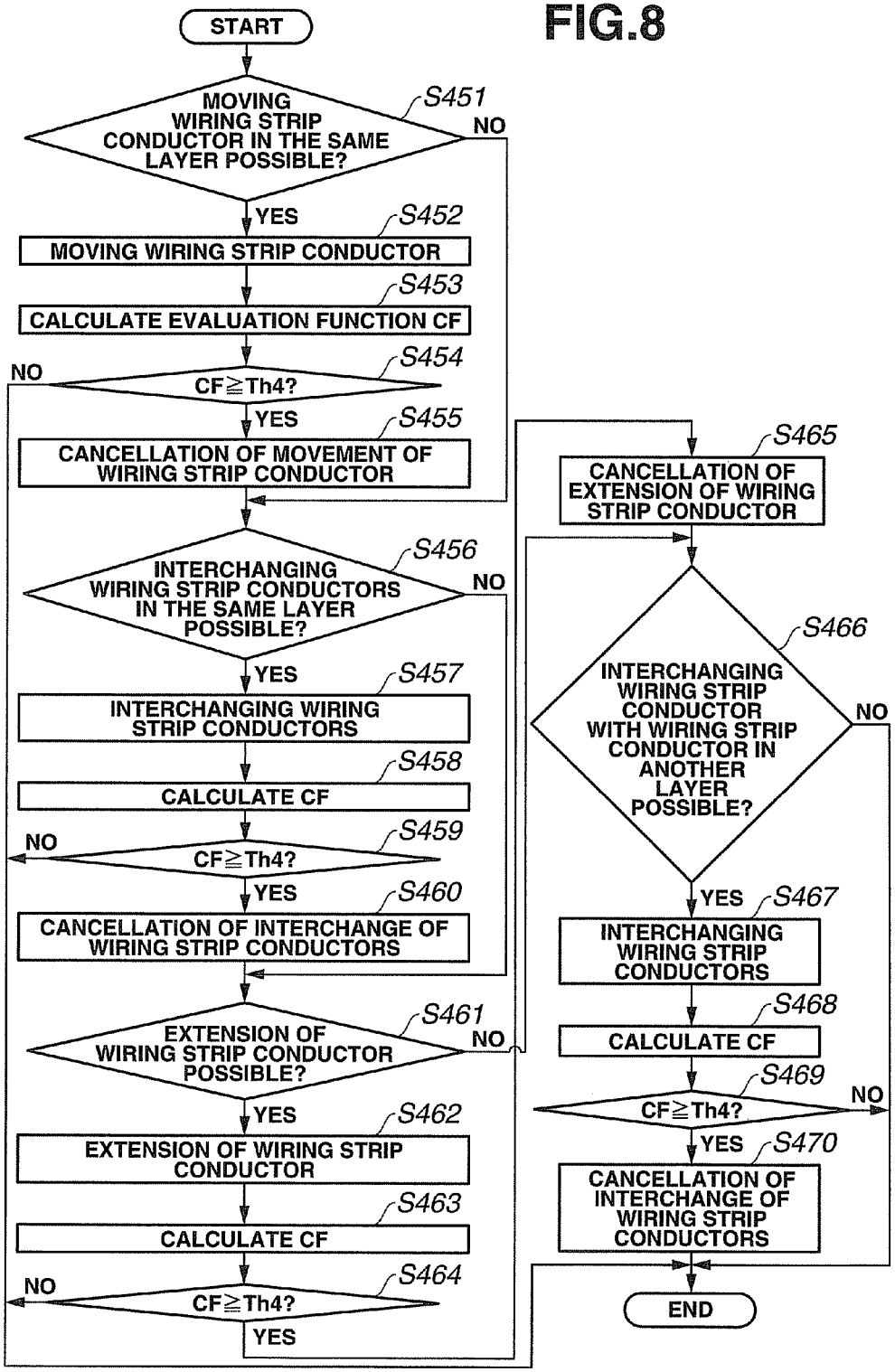
FIG. 8 is a flowchart for explaining the procedure of rewiring of the areas in the vicinity of the evaluation subject CP12.

The detailed procedure of the rewiring in the step S45 will be explained with reference to FIG. 8. FIG. 8 is a flowchart for explaining the procedure of rewiring of the areas in the vicinity of the evaluation subject CP12. The major method for rewiring includes three methods, i.e., moving a wiring strip conductor, interchanging wiring strip conductors, and extending a wiring strip conductor. The methods of moving a wiring strip conductor and interchanging wiring strip conductors are each performed either within the evaluation subject layer 11 including the evaluation subject CP12 between the evaluation subject layer 11 and another layer.

Figure 9A:
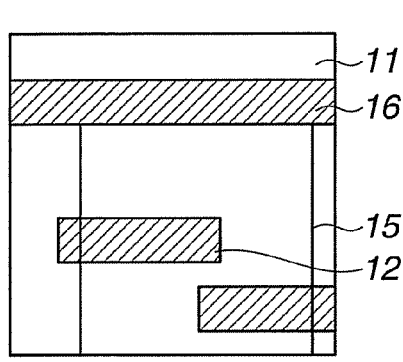
FIG. 9A is a layout chart for explaining an example of rewiring by moving a wiring strip conductor and explaining a wiring pattern in the case where the rewiring has not been performed yet.
Figure 9B:
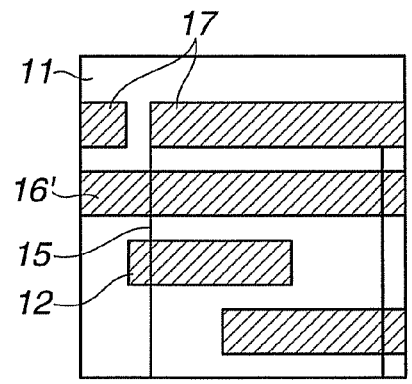
FIG. 9B is a layout chart for explaining an example of rewiring by moving a wiring strip conductor and explaining a wiring pattern in the case where the rewiring has been performed.

In the first place, the first method, i.e., the method of moving a wiring strip conductor will specifically be explained with reference to FIGS. 9A and 9B. FIG. 9A is a layout chart for explaining an example of rewiring by moving a wiring strip conductor and explaining a wiring pattern in the case where the rewiring has not been performed yet. In addition, FIG. 9B is a layout chart for explaining an example of rewiring by moving a wiring strip conductor and explaining a wiring pattern in the case where the rewiring has been performed. Here, the movement of a wiring strip conductor within the evaluation subject layer 11 will be explained. For example, as represented in FIG. 9A, in the case where, in the frame 15, no wiring strip conductor is laid on a track that is one track upper than the evaluation subject CP12, a wiring strip conductor 16 laid on a track that is two tracks upper the evaluation subject CP12 is moved onto the track that is one track upper than the evaluation subject CP12, so that the wiring filling rate α in the frame 15 can be raised (refer to a wiring strip conductor 16' in FIG. 9B). Note that, wiring strip conductors 17 in FIG. 9B are moved, for the purpose of rewiring, from an area, outside the display range of FIG. 9A, where the wiring strip conductors 17 have been laid.

As described above, the method of moving a wiring strip conductor denotes a method in which the wiring strip conductor 16 laid in an area that is away from the evaluation subject CP12 is removed and then laid in an area that is in the vicinity of the evaluation subject CP12 and in which no wiring strip conductor is laid, or, contrary to the above, a method in which a wiring strip conductor laid in an area in the vicinity of the evaluation subject CP12 is removed and then laid in an area that is away front a delay CP and in which no wiring strip conductor is laid.

Figure 10A:
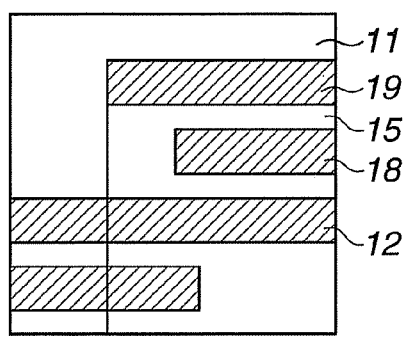
FIG. 10A is a layout chart for explaining an example of rewiring by interchanging wiring strip conductors and explaining a wiring pattern in the case where the rewiring has not been performed yet.
Figure 10B:
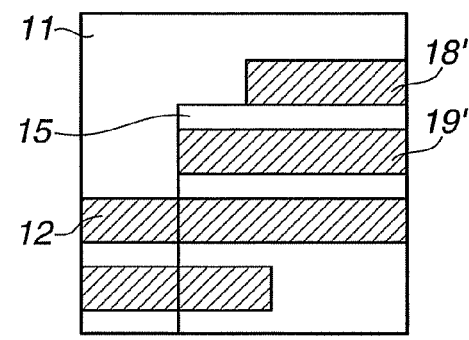
FIG. 10B is a layout chart for explaining an example of rewiring by interchanging wiring strip conductors and explaining a wiring pattern in the case where the rewiring has been performed.

Next, the second method, i.e., the method of interchanging wiring strip conductors will specifically be explained with reference to FIGS. 10A and 10B. FIG. 10A is a layout chart for explaining an example of rewiring by interchanging wiring strip conductors and explaining a wiring pattern in the case where the rewiring has not been performed yet. And, FIG. 10B is a layout chart for explaining an example of rewiring by interchanging wiring strip conductors and explaining a wiring pattern in the case where the rewiring has been performed. Here, the interchange of wiring strip conductors within the evaluation subject layer 11 will be explained. For example, as represented in FIG. 10A, in the case where, in the frame 15, a short wiring strip conductor 18 is laid on a track that is one track upper than the evaluation subject CP12 and a wiring strip conductor 19, which is longer than the wiring strip conductor 18, is laid on a track that is one track upper than the wiring strip conductor 18, by interchanging the wiring strip conductor 18 with the wiring strip conductor 19, the opposing end points, of the wiring strip conductors, which are situated on adjacent tracks that are each upper and lower than the evaluation subject CP12 in the frame 15 can be cancelled; therefore, by reducing the variation in the size of a wiring strip conductor the delay in which is critical, the variation in delay can be suppressed (refer to wiring strip conductors 18' and 19' in FIG. 10B).

Figure 11A:
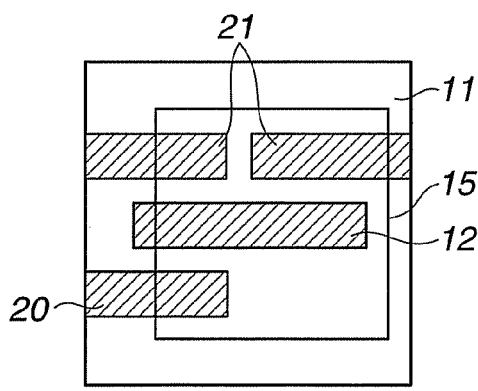
FIG. 11A is a layout chart for explaining an example of rewiring by extending a wiring strip conductor and explaining a wiring pattern in the case where the rewiring has not been performed yet.
Figure 11B:
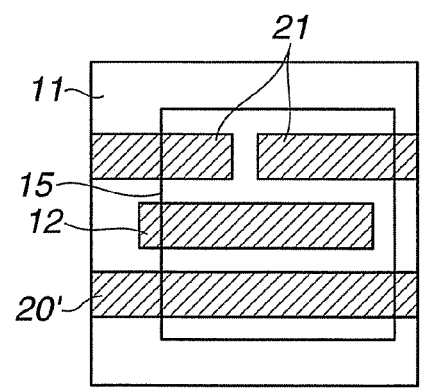
FIG. 11B is a layout chart for explaining an example of rewiring by extending a wiring strip conductor and explaining a wiring pattern in the case where the rewiring has been performed.

In the last place, the third method, i.e., the method of extending a wiring strip conductor will specifically be explained with reference to FIGS. 11A and 11B. FIG. 11A is a layout chart for explaining an example of rewiring by extending a wiring strip conductor and explaining a wiring pattern in the case where the rewiring has not been performed yet. And, FIG. 11B is a layout chart for explaining an example of rewiring by extending a wiring strip conductor and explaining a wiring pattern in the case where the rewiring has been performed. For example, as represented in FIG. 11A, in the case where, in the frame 15, a short wiring strip conductor 20 is laid on a track that is one track lower than the evaluation subject CP12 and other wiring strip conductors 21 is laid on a track that is one track upper than the evaluation subject CP12, by extending the right-hand end portion of the wiring strip conductor 20, the number C of the vertexes, of the end portions of wiring strip conductors, which are situated within the frame 15 can be reduced (refer to a wiring strip conductor 20' in FIG. 11B).

In the step S45, the feasibility of the rewiring methods, among the foregoing methods, which are not accompanied by a significant modification of the wiring layout are examined, in order of increasing rewiring cost. Specifically, the feasibility of the rewiring methods are examined in order of moving a wiring strip conductor within the same layer, interchanging wiring strip conductors within the same layer, extending a wiring strip conductor, and moving a wiring strip conductor or interchanging, between different layers.

Firstly, in the step S451, the feasibility of rewiring by movement within the evaluation subject layer 11 is determined. For example, in the case where the wiring layout before the rewiring is as represented in FIG. 9A and, in the step S43, it is determined that, because the wiring filling rate α is smaller than the threshold value Th2, rewiring is required, it is determined whether or not a space is available for moving a wiring strip conductor to an area in the vicinity of the evaluation subject CP12 from another area. In the case of FIG. 9A, because no wiring strip conductor is laid on a track that is one track upper than the evaluation subject CP12 and a vacant space exists, a wiring strip conductor can be moved; by moving the wiring strip conductor 16, the wiring filling rate α' satisfies Th2≦α'≦Th3, whereby it is determined that a wiring strip conductor can be moved.

In the step S451, in the case where it is determined that rewiring by movement is infeasible, the step S451 is followed by the step S456, and then the feasibility of another rewiring method is determined. In contrast, in the step S451, in the case where it is determined that rewiring by movement is feasible, the step S451 is followed by the step S452, and then the rewiring is performed (refer to FIG. 9B). Subsequently, in the step S453, the evaluation function CF for the whole evaluation subject layer 11 after the rewiring is performed. The evaluation function CF denotes a function for calculating the uniformity of the wiring pattern of the areas in the vicinity of the overall evaluation subject CP12; for example, the evaluation function CF for the whole evaluation subject layer 11 is obtained by calculating respective evaluation values, for all the sub-areas 13 each including the evaluation subject CP12, which are weighted in accordance with the corresponding uniformities of the sub-areas 13, and then making the summation of those evaluation values.

In the step S454, it is determined whether or not the evaluation function CF calculated in the step S453 is an appropriate value, and the rewiring has enabled the wiring pattern of the area in the vicinity of the evaluation subject CP12 to obtain an appropriate uniformity. In the present embodiment, in the case where the evaluation function CF is smaller than the threshold value Th4, it is determined that the wiring pattern of the area in the vicinity of the evaluation subject CP12 has a uniformity such that variation in the size of a wiring strip conductor, due to processing, falls within a tolerance range. Note that, the threshold value Th4 is set to an appropriate value in accordance with the evaluation function CF, a process condition, or the like.

In the step S454, in the case where it is determined that the evaluation function CF is smaller than the threshold value Th4, the rewiring in the step S45 is ended and the step S45 is followed by the step S46. In contrast, in the step S454, in the case where it is determined that the evaluation function CF is the same as or larger than the threshold value Th4, it is considered that the rewiring performed in the step S452 has been inappropriate, whereby no appropriate uniformity has been obtained; then, the step S454 is followed by the step S455. In the following step S455, the wiring pattern is returned to the state prior to the rewiring in the step S452, and then the step S455 is followed by the step S456.

In the step S456, the feasibility of rewiring, within the evaluation subject layer 11, by interchanging wiring strip conductors is determined. For example, in the case where the wiring layout before the rewiring is as represented in FIG. 10A and, in the step S43, it is determined that, because the opposing end points, of wiring strip conductors, which are situated on the respective adjacent tracks that are each one track upper and lower than the evaluation subject CP12 in the frame 15, rewiring is required, it is determined whether or not a short wiring strip conductor in an area in the vicinity of the evaluation subject CP12 and a long wiring strip conductor in another area can be interchanged. In the case of FIG. 10A, the short wiring strip conductor 18 laid on a track that is one track upper than the evaluation subject CP12 can be interchanged with the long wiring strip conductor 19 laid on a track that is one track upper than the wiring strip conductor 18; by interchanging the wiring strip conductor 18 with the wiring strip conductor 19, the opposing end points, of the wiring strip conductors, which are situated on the respective adjacent tracks that are each upper and lower than the evaluation subject CP12 in the frame 15 can be cancelled; therefore, by reducing the variation in the size of a wiring strip conductor the delay in which is critical, the variation in delay can be suppressed, whereby it is determined that the wiring strip conductors can be interchanged.

In addition, for example, in the case where the wiring layout before the rewiring is as represented in FIG. 6A and, in the step S43, it is determined that, because the number C of the vertexes of the end portions of the wiring strip conductors is the same as or larger than the threshold value Th1, rewiring is required, it is determined whether or not a group of short wiring strip conductors laid on a wiring track in an area in the vicinity of the evaluation subject CP12 and a long wiring strip conductor laid on a wiring track in another area can be interchanged. In the case of FIG. 6A, a group of short wiring strip conductors 22 laid on a track that is one track upper than the evaluation subject CP12 can be interchanged with a long wiring strip conductor 23 laid on a track that is one track upper than the group of short wiring strip conductors 22; by interchanging the group of short wiring strip conductors 22 with the long wiring strip conductor 23, the number C' of the vertexes of the end portions of the wiring strip conductors satisfies the equation C'<Th1, whereby it is determined that the wiring strip conductors can be interchanged.

In the case where, in the step S456, it is determined that rewiring by interchanging wiring strip conductors is infeasible, the step S456 is followed by the step S461, and then the feasibility of another rewiring method is determined. In contrast, in the case where, in the step S456, it is determined that rewiring by interchanging wiring strip conductors is feasible, the step S456 is followed by the step S457, and then the rewiring is performed (refer to FIGS. 10B and 6B). Subsequently, in the step S458, the evaluation function CF for the whole evaluation subject layer 11 after the rewiring is calculated, and in the step S459, it is determined whether or not the evaluation function CF is the same as or larger than the threshold value Th4. Note that, the processing items in the steps S458 and S459 are the same as those in the steps S453 and S454, respectively.

In the case where, in the step S459, it is determined that the evaluation function CF is smaller than the threshold value Th4, the rewiring in the step S45 is ended and the step S45 is followed by the step S46. In contrast, in the case where, in the step S459, it is determined that the evaluation function CF is the same as or larger than the threshold value Th4, it is considered that the rewiring performed in the step s457 has been inappropriate, whereby an appropriate uniformity has not been obtained; then, the step S459 is followed by the step S460. In the following step S460, the wiring pattern is returned to the state prior to the rewiring in the step S457, and then the step S460 is followed by the step S461.

In the step S461, the feasibility of rewiring, within the evaluation subject layer 11, by extending a wiring strip conductor is determined. For example, in the case where the wiring layout before the rewiring is as represented in FIG. 11A and, in the step S43, it is determined that, because the number C of the vertexes of the end portions of the wiring strip conductors is the same as or larger than the threshold value Th1, rewiring is required, it is determined whether or not a short wiring strip conductor in an area in the vicinity of the evaluation subject CP12 can be extended up to an area outside the frame 15. In the case of FIG. 11A, no wiring strip conductor is laid in the area on the right of the short wiring strip conductor 20 laid on a track that is one track lower than the evaluation subject CP12, whereby the wiring strip conductor 20 can be extended, and by extending the short wiring strip conductor 20, the number C' of the vertexes of the end portions of the wiring strip conductors satisfies the equation C'<Th1; therefore, it is determined that the wiring strip conductor can be extended.

In the step S461, in the case where it is determined that rewiring by extension is infeasible, the step S461 is followed by the step S466, and then the feasibility of another rewiring method is determined. In contrast, in the step S461, in the case where it is determined that rewiring by extension is feasible, the step S461 is followed by the step S462, and then the rewiring is performed (refer to FIG. 11B). Subsequently, in the step S463, the evaluation function CF for the whole evaluation subject layer 11 after the rewiring is calculated, and in the step S464, it is determined whether or not the evaluation function CF is the same as or larger than the threshold value Th4. Note that, the processing items in the steps S463 and S464 are the same as those in the steps S453 and S454, respectively.

In the step S464, in the case where it is determined that the evaluation function CF is smaller than the threshold value Th4, the rewiring in the step S45 is ended and the step S45 is followed by the step S46. In contrast, in the step S464, in the case where it is determined that the evaluation function CF is the same as or larger than the threshold value Th4, it is considered that the rewiring performed in the step S462 has been inappropriate, whereby no appropriate uniformity has been obtained; then, the step S464 is followed by the step S465. In the following step S465, the wiring pattern is returned to the state prior to the rewiring in the step S462, and then the step S465 is followed by the step S466.

In the step S466, it is determined whether or not the rewiring, by moving a wiring strip conductor or by interchanging wiring strip conductors, between the evaluation subject layer 11 and another layer, is feasible. In the step S466, in the case where it is determined that moving a wiring strip conductor or interchanging wiring strip conductors, between the evaluation subject layer 11 and another layer, is infeasible, it is determined that the rewiring is infeasible; then, the rewiring in the step S45 is ended and the step S45 is followed by the step S46. In contrast, in the step S466, in the case where it is determined that the rewiring, by moving a wiring strip conductor or by interchanging wiring strip conductors, between the evaluation subject layer 11 and another layer, is feasible, the step S466 is followed by the step S467, and then the rewiring is performed. Subsequently, in the step S468, the evaluation function CF for the whole evaluation subject layer 11 after the rewiring is calculated, and in the step S469, it is determined whether or not the evaluation function CF is the same as or larger than the threshold value Th4. Note that, the processing items in the steps S468 and S469 are the same as those in the steps S453 and S454, respectively.

In the step S469, in the case where it is determined that the evaluation function CF is smaller than the threshold value Th4, the rewiring in the step S45 is ended and the step S45 is followed by the step S46. In contrast, in the step S469, in the case where it is determined that the evaluation function CF is the same as or larger than the threshold value Th4, it is considered that the rewiring performed in the step S467 has been inappropriate, whereby no appropriate uniformity has been obtained; then, the step S469 is followed by the step S470. In the following step 8470, the wiring pattern is returned to the state prior to the rewiring in the step S467, the rewiring in the step S45 is ended and then followed by the step S46. Note that, the calculation of the evaluation function CF in each of the steps S453, S458, S463, and S468 and the uniformity evaluation, on a wiring pattern, through comparison of the evaluation function CF with the threshold value Th4 in each of the steps S454, S459, S464, and S469 are performed in the strip-conductor-size variation determination unit 5.

After, in accordance with the foregoing procedure, the rewiring is performed in the sub-areas 13 to which the frame 15 has been set, it is determined in the step S46 whether or not a series of processing items including the wiring-pattern evaluation and the rewiring have been applied to all the sub-areas 13 extracted in the step S41. In the case where the series of processing items have been applied to all the sub-areas 13 each including the evaluation subject CP12, the wiring-pattern evaluation and the rewiring in the step S4 are ended, and then the step S4 is followed by the step S5. In contrast, in the case where it is determined that there remain some sub-areas 13 to which the wiring-pattern evaluation and the rewiring have not been applied, the step S46 is followed by the step S47 where the frame 15 is set to the sub-areas 13 to which the series of processing items have not been applied, and then a series of procedures in the steps S43 to S45 are performed.

In the step S5, another delay CP in the evaluation subject layer 11 is selected as the evaluation subject CP12. In the following step S6, it is determined whether or not the wiring-pattern evaluation and the rewiring have been applied to all the delay CPs in the evaluation subject layer 11. In the case where the wiring-pattern evaluation and the rewiring have been applied to all the delay CPs, the step S6 is followed by the step S7 where another layer is selected as the evaluation subject layer 11. In contrast, in the case where it is determined that there remain some delay CPs to which the wiring-pattern evaluation and the rewiring have not been applied, the processing items in the steps S3 and S4 are applied to all the delay CPs in the evaluation subject layer 11.

In the step S8, it is determined whether or not the wiring-pattern evaluation and the rewiring have been applied to all the layers. In the case where the wiring-pattern evaluation and the rewiring have been applied to all the layers, the rewiring in the rewiring unit 4 and the processing, in the strip-conductor-size variation determination unit 5, in which the uniformity of a pattern is evaluated so as to determine whether or not the variation in the size of a critical wiring strip conductor falls within a tolerance range are ended, and then the OPC processing is performed. In contrast, in the case where it is determined that there remain some layers to which the wiring-pattern evaluation and the rewiring have not been applied, the processing items in the steps S2 to S4 are applied to all the layers.

The OPC processing, which is a processing in which, based on the wiring layout to which a series of rewiring processing items in the steps S1 to S8 have been applied, necessary correction processing is applied to a mask layout so as to suppress the optical proximity effect, is performed in the mask-layout processing process.

In the present embodiment, the uniformity of the wiring layout in the areas in the vicinity of a delay CP is improved before the OPC processing; therefore, the difference between the estimated value for the size of a wiring strip conductor at a designing stage and the size value of the produced wiring strip conductor is small, whereby the error between the estimated timing value at a designing stage and the actual-chip timing can be diminished.

In the case where, after the evaluation on the uniformity of a wiring layout to which rearrangement has been applied, it is determined that the variation in the size of a critical wiring strip conductor falls within a tolerance range, the wiring layout processing according to the present embodiment is completed.

Note that, the processing of detecting a delay CP and a series of rewiring processing in the steps S1 to S8, which are described in a program, are automatically carried out by use of a computer.

As described above, in the present embodiment, with regard to an ordinary wiring layout, the uniformity of a wiring patters is evaluated; a non-uniform area is rewired so that the non-uniform area has a uniformity such that the variation, in the size of a wiring strip conductor, due to processing falls within a tolerance range. Because the rewiring enables processing based on a wiring pattern whose uniformity has been improved, variation in the size of a wiring strip conductor can be suppressed. Because being performed only in the areas in the vicinity of a wiring strip conductor (i.e., a delay CP) that becomes a bottleneck in terms of signal propagation delay, the rewiring can be carried out without spending a considerable time. Moreover, because the variation in the size of a delay CP is securely suppressed so as to reduce variations in the resistance and the capacitance, the variation in signal delay, i.e., the difference between the estimated value for the size of a wiring strip conductor at a designing stage and the size value of the produced wiring strip conductor is small, whereby the error between the estimated timing value at a designing stage and the actual-chip timing can be diminished; thus, the yield rate of the chip can be enhanced. Still moreover, by utilizing a design pattern laid out according to the present example, the computer-processing time required for data processing in the OPC processing can also be reduced.

Note that, in the present embodiment, a sub-area 13 has been rewired by use of a single method only; however, the rewiring may be performed by use of a method in which a plurality of methods is combined. For example, in order to enlarge the wiring filling rate α, it may be allowed that a wiring strip conductor is moved to a vacant area in the vicinity of a delay CP from another area, and a short wiring strip conductor laid in an area in the vicinity of a delay CP and a long wiring strip conductor laid in another area are interchanged. In addition, in the present embodiment, the wiring-pattern evaluation and the rewiring are performed only one time for each sub-area including a delay CP; however, in order to explore a more uniform wiring pattern, the wiring-pattern evaluation and the rewiring may recurrently be performed until the evaluation function CF converges to a preferable value.

According to the foregoing embodiment, a wiring layout apparatus, a layout method, and a program for a semiconductor integrated circuit can be realized in which variation in delay, due to variation in the size of a wiring strip conductor, which is produced in a production process is reduced utilizing as few dummy wiring strip conductors as possible, and the delay analysis at the layout designing stage is made more accurate, so that the target operating frequency of the circuit is readily achieved.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A wiring layout apparatus for a semiconductor integrated circuit, the apparatus comprising:
    a layout design unit configured to design a wiring layout for a semiconductor integrated circuit;
    a critical wiring detection unit configured to analyze a delay of signal propagation in the wiring layout so as to detect wiring strip conductors that configure a signal path whose timing is critical;
    a rewiring unit configured to rearrange the wiring strip conductors so as to improve the uniformity of a wiring pattern of an area in the vicinity of the critical wiring strip conductor, with regard to the wiring layout; and
    a strip-conductor-size variation determination unit configured to evaluate the uniformity of the pattern of the rearranged wiring layout so as to determine whether or not variation in the size of the critical wiring strip conductor falls within a tolerance range, wherein
    in the rewiring unit and the strip-conductor-size variation determination unit, the uniformity of the wiring pattern is determined, based on a filling rate of the wiring strip conductors in the area in the vicinity of the critical wiring strip conductor and the number of the vertexes, of end portions of the wiring strip conductors, which exist in the area in the vicinity of the critical wiring strip conductor; and
    the rewiring unit rearranges the wiring strip conductors by performing at least one of the following operations: removing the wiring strip conductor laid in the area in the vicinity of the critical wiring strip conductor and laying the wiring strip conductor in another area; removing the wiring strip conductor laid in another area and laying the wiring strip conductor in the area in the vicinity of the critical wiring strip conductor; interchanging the wiring strip conductor laid in the area in the vicinity of the critical wiring strip conductor and the wiring strip conductor laid in another area; and extending the wiring strip conductor laid in the area in the vicinity of the critical wiring strip conductor.

2. The wiring layout apparatus for a semiconductor integrated circuit, according to claim 1, wherein the rewiring unit rearranges the wiring strip conductors in such a way as not to include a predetermined specific wiring pattern.

3. Wiring layout method for a semiconductor integrated circuit, the method being realized by a computer including a layout design unit, a critical wiring detection unit, a rewiring unit and a strip-conductor-size variation determination unit, the method comprising:
    designing a wiring layout for a semiconductor integrated circuit, by the layout design unit;
    analyzing a delay of signal propagation in the wiring layout so as to detect wiring strip conductors that configure a signal path whose timing is critical, by the critical wiring detection unit;
    determining, with regard to the wiring layout, the uniformity of a wiring pattern of an area in the vicinity of the critical wiring strip conductor, based on a filling rate of the wiring strip conductors in the area in the vicinity of the critical wiring strip conductor and the number of the vertexes, of end portions of the wiring strip conductors, which exist in the area in the vicinity of the critical wiring strip conductor, and when it is determined that the wiring pattern is non-uniform, rearranging, so as to improve the uniformity of the wiring pattern, the wiring strip conductors by performing at least one of the following operations: removing the wiring strip conductor laid in the area in the vicinity of the critical wiring strip conductor and laying the wiring strip conductor in another area; removing the wiring strip conductor laid in another area and laying the wiring strip conductor in the area in the vicinity of the critical wiring strip conductor; interchanging the wiring strip conductor laid in the area in the vicinity of the critical wiring strip conductor and the wiring strip conductor laid in another area; and extending the wiring strip conductor laid in the area in the vicinity of the critical wiring strip conductor, by the rewiring unit; and determining and evaluating the uniformity of the pattern of the rearranged wiring layout based on the filling rate of the wiring strip conductors in the area in the vicinity of the critical wiring strip conductor and the number of the vertexes, of the end portions of the wiring strip conductors, which exist in the area in the vicinity of the critical wiring strip conductor, so as to determine whether or not variation in the size of the critical wiring strip conductor falls within a tolerance range, by the strip-conductor-size variation determination unit.

4. The method, according to claim 3, wherein the wiring strip conductors are rearranged in such a way as not to include a predetermined specific wiring pattern.

5. A computer-readable medium including a wiring layout program for a semiconductor integrated circuit, the program comprising:

a critical wiring detection procedure of analyzing a delay of signal propagation in the wiring layout based on the result of wiring layout for a semiconductor integrated circuit so as to detect wiring strip conductors that configure a signal path whose timing is critical; and a rewiring procedure including a procedure of evaluating, with regard to the wiring layout, the uniformity of a wiring pattern based on a filling rate of the wiring strip conductors in the area in the vicinity of the critical wiring strip conductor and the number of the vertexes, of end portions of the wiring strip conductors, which exist in the area in the vicinity of the critical wiring strip conductor and performing rewiring so as to improve the uniformity of the wiring pattern, and a wiring optimizing procedure of performing rewiring by at least one of moving, or by interchanging, or extending the wiring strip conductors, and causing the computer to execute these series of procedures.

6. The computer-readable medium according to claim 5, wherein the rewiring procedure rearranges the wiring strip conductors in such a way as not to include a predetermined specific wiring pattern.

* * * * *